United States Patent
Jia et al.

(10) Patent No.: US 10,416,222 B2
(45) Date of Patent: Sep. 17, 2019

(54) DETECTION METHOD AND SYSTEM FOR PANTOGRAPH ARC BASED ON TRAIN POWER SUPPLY SYSTEM

(71) Applicant: CRRC QINGDAO SIFANG CO., LTD., Qingdao, Shandong (CN)

(72) Inventors: Buchao Jia, Shandong (CN); Jinghai Jiao, Shandong (CN); Fangdong Hou, Shandong (CN); Jianhong You, Shandong (CN); Zhiguo Yu, Shandong (CN); Haijun Zhou, Shandong (CN); Pankui Yang, Shandong (CN)

(73) Assignee: CRRC QINGDAO SIFANG CO., LTD., Qingdao, Shandong (CN)

( * ) Notice: Subject to any disclaimer, the term of this patent is extended or adjusted under 35 U.S.C. 154(b) by 241 days.

(21) Appl. No.: 15/504,976

(22) PCT Filed: Nov. 13, 2015

(86) PCT No.: PCT/CN2015/094565
§ 371 (c)(1),
(2) Date: Feb. 17, 2017

(87) PCT Pub. No.: WO2016/119510
PCT Pub. Date: Aug. 4, 2016

(65) Prior Publication Data
US 2017/0276716 A1 Sep. 28, 2017

(30) Foreign Application Priority Data
Jan. 27, 2015 (CN) .......................... 2015 1 0041675

(51) Int. Cl.
*G01R 31/02* (2006.01)
*G01R 31/00* (2006.01)
*G01R 31/40* (2014.01)
*B60L 5/18* (2006.01)
*B60L 9/08* (2006.01)
*G01R 31/14* (2006.01)
(Continued)

(52) U.S. Cl.
CPC .............. *G01R 31/025* (2013.01); *B60L 5/18* (2013.01); *B60L 9/08* (2013.01); *G01R 31/005* (2013.01);
(Continued)

(58) Field of Classification Search
CPC .... G01R 31/025; G01R 31/14; G01R 31/005; G01R 31/40; G01R 31/008; B60L 9/08; B60L 5/18
See application file for complete search history.

(56) References Cited

U.S. PATENT DOCUMENTS 2,864,958 A * 12/1958 Montford ................. H05G 1/70
378/112
2002/0139629 A1 10/2002 Alstom
(Continued)

FOREIGN PATENT DOCUMENTS

CN 201457094 U 5/2010
CN 102053196 A 5/2011
(Continued)

OTHER PUBLICATIONS

English machine translation of Liu et al. CN 102590653 (Year: 2012).*
(Continued)

*Primary Examiner* — Lee E Rodak
(74) *Attorney, Agent, or Firm* — Yue (Robert) Xu; Apex Attorneys at Law, LLP

(57) ABSTRACT

A method and a system for detecting a pantograph-catenary electric arc based on a train power supply system are provided. The method includes: boosting, by a booster transformer, a voltage of alternating current transmitted via an electric network, to generate high voltage electrical energy, where a high voltage and a great current are generated in a gap between a catenary wire and a pantograph in
(Continued)

a discharging circuit with the high voltage electrical energy; and collecting an electric arc generated in the gap between the catenary wire and the pantograph in a case of the high voltage and the great current.

9 Claims, 2 Drawing Sheets

(52) U.S. Cl.
CPC ............ *G01R 31/14* (2013.01); *G01R 31/40* (2013.01); *G01R 31/008* (2013.01)

(56) References Cited

U.S. PATENT DOCUMENTS

2015/0263604 A1* 9/2015 Nagatsuka ................ B60L 9/28
 363/44
2016/0311342 A1* 10/2016 Peng ..................... G06T 7/0004

FOREIGN PATENT DOCUMENTS

| | | | |
|---|---|---|---|
| CN | 102590653 | * | 7/2012 |
| CN | 102616156 | A | 8/2012 |
| CN | 102879679 | A | 1/2013 |
| CN | 104597354 | A | 5/2015 |
| CN | 204389636 | U | 6/2015 |

OTHER PUBLICATIONS

International Search Report for PCT/CN2015/094565, dated Feb. 16, 2016, ISA/CN.

Wang, Junru et al, Influence of Load Characteristics of Electric Locomotive on Pantograph-Catenary Electric Arc, China Water Transport, Sep. 30, 2010 (Sep. 30, 2010) vol. 10, No. 9 ISSN:1006-7973 pp. 108-110.

The 1st Office Action dated Feb. 4, 2017 for Chinese Application No. 201510041675.5.

* cited by examiner

| The booster transformer boosts a voltage of alternating current transmitted via the electric network, to generate high voltage electrical energy. A high voltage and a great current are generated in a gap between the catenary wire and the pantograph in the discharging circuit with the high voltage electrical energy. | ─ S22 |

| An electric arc generated in the gap between the catenary wire and the pantograph in a case of the high voltage and the great current is collected. | ─ S24 |

Figure 2

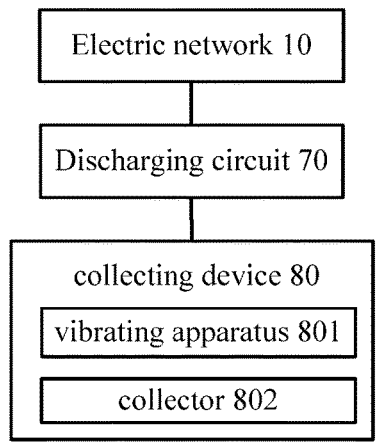

Figure 3

DETECTION METHOD AND SYSTEM FOR PANTOGRAPH ARC BASED ON TRAIN POWER SUPPLY SYSTEM

The present application is a National Stage application of PCT international application PCT/CN2015/094565, filed on Nov. 13, 2015 which claims the priority to Chinese Patent Application No. 201510041675.5, titled "DETECTION METHOD AND SYSTEM FOR PANTOGRAPH ARC BASED ON TRAIN POWER SUPPLY SYSTEM", filed on Jan. 27, 2015 with the State Intellectual Property Office of the PRC, both of which are incorporated herein by reference in their entireties.

FIELD

The present disclosure relates to the field of train, and in particular to a method and a system for detecting a pantograph-catenary electric arc based on a train power supply system.

BACKGROUND

In recent years, high-speed railway is developing rapidly, and a high-speed train obtains electrical energy from a catenary via a sliding contact between a catenary wire and a pantograph pan. However, with acceleration of the train, coupled vibration is aggravated while the catenary and a pantograph are contacting with each other, heavily deteriorating a status of electrical contact between the pantograph and the catenary and resulting in frequent occurrences of disconnections of a pantograph-catenary (the pantograph and the catenary). And pantograph-catenary electric arcs generated during occurrence of the disconnections severely burn the catenary wire and the pantograph pan, posing a huge threat to safe operating of the high-speed train, which has become a technical bottleneck constraining further development of the high-speed railway of China. Hence, systematical and deep researches on features of the pantograph-catenary electric arc are required urgently. In a real running high-speed train, due to limitations such as practical conditions and device installation space, there is a great difficulty in detecting performance parameters of the pantograph-catenary electric arc in the field. In conventional technology, a simulation testing system is employed to research features of the pantograph-catenary electric arc. In a simulation test of detecting the pantograph-catenary electric arc, how to provide a case of a high voltage and a great current is the key to a test on the pantograph-catenary electric arc.

It should be noted herein that currently, conventional methods for performing a test on a pantograph-catenary electric arc have the following disadvantages. First, in a case that a conventional high-voltage and great-current power supply is employed, a power supply with a power of several megawatts is needed, and megawatts of power is frequently inputted and cut off at an electric network side as needed by the test, which easily causes instability of a power supply system. Second, in a case that a solution of a low voltage and a great current power supply or a solution of a high voltage and a small current power supply is employed, there is a difference between the simulation test and a practical operating condition that there is a high voltage and a great current in a gap between the pantograph and the catenary. Third, in a solution of storing energy in a capacitor and performing the test on the pantograph-catenary electric arc by discharging through an inductor, the generated voltage and current attenuate rapidly and exponentially because a resistance of a discharging circuit is hard to reduce, failing to meet requirements of the test on the pantograph-catenary electric arc.

Currently, there is no effective solution to solve the technical problem that energy consumption is high due to power supplying with a high voltage alternating current voltage source for generation of a high voltage and a great current in a gap between a pantograph and a catenary in the methods for performing a simulation test on a pantograph-catenary electric arc according to conventional technology.

SUMMARY

The object of the present disclosure is to provide a method and a system for detecting a pantograph-catenary electric arc based on a train power supply system, to solve the technical problem that energy consumption is high due to power supplying with a high voltage alternating current voltage source for generation of a high voltage and a great current in a gap between a pantograph and a catenary in the methods for performing a simulation test on a pantograph-catenary electric arc according to conventional technology.

To achieve the object above, a method for detecting a pantograph-catenary electric arc based on a train power supply system is provided according to an aspect of the present disclosure. The train power supply system includes an electric network and a discharging circuit, the discharging circuit includes a booster transformer, a current limiting resistor, a step-down transformer, a catenary wire and a pantograph. The method includes: boosting, by the booster transformer, a voltage of alternating current transmitted via the electric network, to generate high voltage electrical energy, where a high voltage and a great current are generated in a gap between the catenary wire and the pantograph in the discharging circuit with the high voltage electrical energy; and collecting an electric arc generated in the gap between the catenary wire and the pantograph in a case of the high voltage and the great current.

To achieve the object above, a system for detecting a pantograph-catenary electric arc based on a train power supply system is provided according to another aspect of the present disclosure. The system includes an electric network, a discharging circuit and a collecting device. The electric network is configured to transmit electrical energy. The discharging circuit includes a booster transformer, a current limiting resistor, a catenary wire and a pantograph, where the booster transformer is configured to boost a voltage of alternating current transmitted via the electric network, to generate high voltage electrical energy, where a high voltage and a great current are generated in a gap between the catenary wire and the pantograph in the discharging circuit with the high voltage electrical energy. The collecting device is configured to collect an electric arc generated in the gap between the catenary wire and the pantograph in a case of the high voltage and the great current.

According to the present disclosure, the voltage of the alternating current transmitted via the electric network is boosted by the booster transformer to generate the high voltage electrical energy, where the high voltage and the great current are generated in the gap between the catenary wire and the pantograph in the discharging circuit with the high voltage electrical energy, and the electric arc generated in the gap between the catenary wire and the pantograph in a case of the high voltage and the great current is collected. The method according to the disclosure solves the technical problem that energy consumption is high due to power supplying with a high voltage alternating current voltage source for generation of a high voltage and a great current in a gap between a pantograph and a catenary in conventional methods for performing a simulation test on a pantograph-catenary electric arc.

BRIEF DESCRIPTION OF THE DRAWINGS

The drawings to be used in the descriptions of embodiments or conventional technology are described briefly as follows, so that technical solutions according to the embodiments of the disclosure or according to conventional technology may become clearer. Apparently, the drawings in the following descriptions only illustrate some embodiments of the disclosure. For those skilled in the art, other drawings may be obtained based on these drawings without any creative work.

FIG. 2 is a flowchart of a method for detecting a pantograph-catenary electric arc based on a train power supply system according to the first embodiment of the disclosure; and FIG. 3 is a schematic diagram of a system for detecting a pantograph-catenary electric arc based on a train power supply system according to a second embodiment of the disclosure.

DETAILED DESCRIPTION

Figure 1:
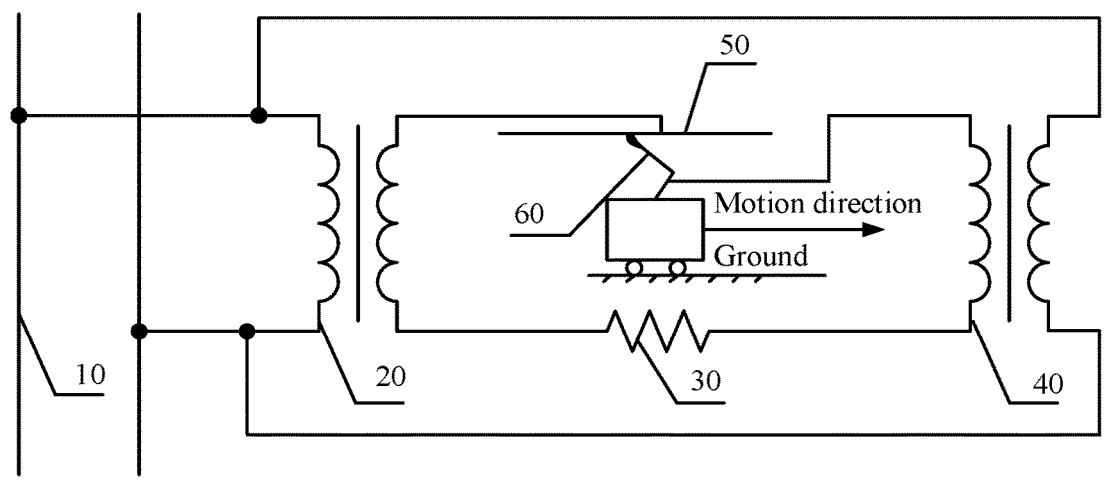
FIG. 1 is a schematic diagram of a train power supply system according to a first embodiment of the disclosure.

Technical solutions according to embodiments of the disclosure are described clearly and completely hereinafter in conjunction with the drawings according to the present disclosure. Apparently, the described embodiments are only a few rather than all of the embodiments of the disclosure. Any other embodiments obtained by those skilled in the art based on the embodiments according to the present disclosure without any creative work fall in the protection scope of the present disclosure.

It should be noted that the embodiments according to the present disclosure and features in the embodiments may be combined with each other in a case of no conflict therebetween.

Technical solutions according to embodiments of the disclosure are described clearly and completely hereinafter in conjunction with the drawings according to the present disclosure, so that those skilled in the art can better understand the technical solutions according to the present disclosure. Apparently, the described embodiments are only a few rather than all of the embodiments of the disclosure. Any other embodiments obtained by those skilled in the art based on the embodiments according to the present disclosure without any creative work fall in the protection scope of the present disclosure.

It should be noted that the terminologies such as "first", "second" and the like in the specification, the claims and the drawings described above of the present disclosure are only used herein to tell apart similar objects, rather than to indicate specific orders or priorities thereof. It should be understood that the terminologies used herein may be replaced by each other, so that embodiments of the disclosure are not limited to the embodiments described herein. Furthermore, terminologies of "include", "comprise" or any other variants are intended to be non-exclusive. For example, a process, method, system, article or device including a series of steps or units is not limited to the steps or units clearly enumerated, but may further include other steps or units not clearly enumerated or inherent to the process, method, article or device.

First Embodiment

A method for detecting a pantograph-catenary electric arc based on a train power supply system is provided according to an embodiment of the disclosure. As shown in FIG. 1, the power supply system may include an electric network 10 and a discharging circuit, and the discharging circuit includes a booster transformer 20, a current limiting resistor 30, a step-down transformer 40, a catenary wire 50 and a pantograph 60.

As shown in FIG. 2, the method may include following steps S22 and S24.

In step S22, the booster transformer boosts a voltage of alternating current transmitted via the electric network, to generate high voltage electrical energy. A high voltage and a great current are generated in a gap between the catenary wire and the pantograph in the discharging circuit with the high voltage electrical energy.

To be specific, in the solution, the above booster transformer may transmit the high voltage electrical energy generated through the boosting to the discharging circuit including the booster transformer 20, the current limiting resistor 30, the step-down transformer 40, the catenary wire 50 and the pantograph 60, to generate the high voltage and the great current in the gap between the catenary wire 50 and the pantograph 60 in the discharging circuit.

In step S24, an electric arc generated in the gap between the catenary wire and the pantograph in a case of the high voltage and the great current is collected.

To be specific, in the solution, after a pantograph-catenary (pantograph and catenary) generates an electric arc, the electric arc generated in the gap between the catenary wire and the pantograph in a case of the high voltage and the great current is collected for further researches.

It should be noted that in practical running of a high-speed train, an electric arc is generated by a pantograph-catenary (pantograph and catenary) in a gap between a pantograph and a catenary in a case of a high voltage and a great current. And therefore, the electric arc generated in the gap between the pantograph and the catenary through the steps above meets requirements of researches on a pantograph-catenary electric arc and can authentically reflect features of the pantograph-catenary electric arc.

In the embodiment, the booster transformer boosts the voltage of the electricity transmitted via the electric network and transmits the high voltage electrical energy to the discharging circuit, to generate the high voltage and the great current in the gap between the catenary wire and the pantograph in the discharging circuit, and the electric arc generated in the gap between the pantograph and the catenary in a case of the high voltage and the great current is collected. In this way, a demand for a high voltage and a great current after the high voltage in the gap between the pantograph and the catenary is met, a power demand on an input end of the electric network is reduced to below 50 KW, a demand for megawatts of instantaneous input power on the electric network is avoided and the technical problem is solved that energy consumption is high due to power supplying with a high voltage alternating current voltage source for generation of a high voltage and a great current in a gap between a pantograph and a catenary in conventional methods for performing a simulation test on a pantograph-catenary electric arc.

Optionally, after the booster transformer boosts the voltage of the alternating current transmitted via the electric network and the high voltage electrical energy is generated in the step S22, the method according to the embodiment may further include the following step:

the step-down transformer reduces a voltage of the high voltage electrical energy and transmits the high voltage electrical energy with the reduced voltage to the booster transformer.

To be specific, in the solution, with reference to FIG. 1, an output end of the step-down transformer 40 may be connected to an input end of the booster transformer 20 to form an energy feedback system. In this way, the high voltage electrical energy may be inputted to the booster transformer 20 again, reducing consumption of electrical energy, and a power supply in the above method can have low energy consumption, strong stability and high reliability. Optionally, the step-down transformer above may have a transfer ratio of 1:125 and a capacity of 60 KVA.

Optionally, the step of generating the high voltage and the great current in the gap between the catenary wire and the pantograph in the discharging circuit with the high voltage electrical energy in the step S22 may include the following step:

after the gap between the catenary wire and the pantograph is broken down by the high voltage electrical energy, the discharging circuit is turned on and the high voltage electrical energy with the great current is generated.

It should be noted herein that with reference to FIG. 1, two-phase alternating current is connected to the input end of the booster transformer 20 via the electric network 10. An output end of the booster transformer 20, the current limiting resistor 30, an input end of the step-down transformer 40, the catenary wire 50 and the pantograph 60 form the discharging circuit. Before the gap between the pantograph and the catenary is broken down, there is no current in the discharging circuit and the step-down transformer 40 does not operate. After the gap between the pantograph and the catenary is broken down, a current is formed in the discharging circuit and the high voltage electrical energy with the great current is generated.

In an optional embodiment, energy outputted by the booster transformer 20 is fed back to the input end of the booster transformer 20 via the step-down transformer 40, to ensure safe operating of an electric network system.

Optionally, the step S24 of collecting the electric arc generated in the gap between the catenary wire and the pantograph in a case of the high voltage and the great current may include a first step and a second step.

In the first step, coupled vibration is brought between the catenary wire and the pantograph to make the catenary wire and the pantograph be disconnected.

To be specific, in the solution, the coupled vibration may be brought between the catenary and the pantograph to simulate a motion status of the catenary wire and the pantograph in actual running of a train, and with aggravation of the coupled vibration between the catenary wire and the pantograph, a status of electrical contact between the catenary wire and the pantograph will be severely deteriorated, which eventually results in the disconnection between the catenary wire and the pantograph.

In the second step, the electric arc generated in the gap between the catenary wire and the pantograph in a case that the catenary wire and the pantograph are disconnected is collected.

Optionally, the second step of collecting the electric arc generated in the gap between the catenary wire and the pantograph in a case that the catenary wire and the pantograph are disconnected may include the following step:

images of the electric arc during a process from the electric arc being generated to the electric arc being extinguished are captured with a camera device.

To be specific, in the solution, the images of the pantograph-catenary electric arc during a process from the electric arc being generated to the electric arc being extinguished may be captured with the camera device, to provide a policy for manufacture and operating of a train by analyzing time of arcing, quenching and reigniting of the pantograph-catenary electric arc.

The present disclosure is described in conjunction with a specific scenario hereinafter.

A high-voltage and great-current power supply apparatus for testing a pantograph-catenary electric arc may be further provided according to the embodiment. With reference to FIG. 1, the apparatus may include the electric network 10, the booster transformer 20, the current limiting resistor 30, the step-down transformer 40, the catenary wire 50 and the pantograph 60. The two-phase alternating current is connected to the input end of the booster transformer 20 via the electric network 10. The output end of the booster transformer 20, the current limiting resistor 30, an input end of the step-down transformer 40, the catenary wire 50 and the pantograph 60 form the discharging circuit. After the gap between the pantograph and the catenary is broken down, a current is formed in the discharging circuit, and energy outputted by the booster transformer 20 is fed back to the input end of the booster transformer 20 via the step-down transformer 40, ensuring safe running of the electric network system. It should be noted herein that the power supply apparatus above may be used to implement the method according to the first embodiment.

According to the present disclosure, one booster transformer and one step-down transformer may be used to replace a high voltage alternating current voltage source, and the booster transformer and the step-down transformer may be connected to each other to form a push-pull structure. The output end of the booster transformer is connected to the input end of the step-down transformer, an output end of the step-down transformer is connected to the input end of the booster transformer, and the catenary wire and the pantograph pan (abbreviated as pantograph-catenary) are connected between the two ends of the booster transformer. When the gap between the pantograph and the catenary is broken down by the high voltage electrical energy, the energy outputted by the booster transformer is fed back to the input end of the booster transformer via the step-down transformer, to provide a great current in the gap between the pantograph and the catenary after the breakdown. With the method, a demand for a high voltage and a great current after the high voltage in the gap between the pantograph and the catenary is met, a power demand on an input end of the electric network is reduced to below 50 KW and a demand for megawatts of instantaneous input power on the electric network is avoided.

With reference to FIG. 1, an operating process of the apparatus above is described as follows. The two-phase alternating current is connected to the input end of the booster transformer 20 via the electric network 10. The output end of the booster transformer 20, the current limiting resistor 30, an input end of the step-down transformer 40, the catenary wire 50 and the pantograph 60 form the discharging circuit. Before the gap between the pantograph and the catenary is broken down, there is no current in the discharging circuit and the step-down transformer 40 does not operate. After the gap between the pantograph and the catenary is broken down, a current is formed in the discharging circuit, and the energy outputted by the booster transformer 20 is fed back to the input end of the booster transformer 20 via the step-down transformer 40, ensuring safe running of the electric network system.

According to the present disclosure, a push-pull structure is formed by the booster transformer and the step-down transformer, and feedback control of electrical energy is achieved, which has the following beneficial effects. An output current is stable, and features of the pantograph-catenary electric arc can be authentically reflected, and the power supply has low energy consumption, strong stability and high reliability. The power supply apparatus for testing an electric arc, which is provided according to the present disclosure in view of features of the pantograph-catenary electric arc, has a slight impact on a power supply grid, low energy consumption and a stable power supply waveform.

Second Embodiment

A system for detecting a pantograph-catenary electric arc based on a train power supply system is provided according to an embodiment of the disclosure. As shown in FIG. 3, the system may include an electric network 10, a discharging circuit 70 and a collecting device 80.

The electric network 10 is configured to transmit electrical energy.

The discharging circuit 70 includes a booster transformer 20, a current limiting resistor 30, a catenary wire 50 and a pantograph 60. The booster transformer 20 is configured to boost a voltage of alternating current transmitted via the electric network to generate high voltage electrical energy. A high voltage and a great current are generated in a gap between the catenary wire 50 and the pantograph 60 in the discharging circuit with the high voltage electrical energy.

The collecting device 80 is configured to collect an electric arc generated in the gap between the catenary wire and the pantograph in a case of the high voltage and the great current.

To be specific, the booster transformer above may transmit the high voltage electrical energy generated through the boosting to the discharging circuit including the booster transformer 20, the current limiting resistor 30, a step-down transformer 40, the catenary wire 50 and the pantograph 60, to generate the high voltage and the great current in the gap between the catenary wire 50 and the pantograph 60 in the discharging circuit. After a pantograph-catenary (pantograph and catenary) generates an electric arc, the electric arc generated in the gap between the catenary wire and the pantograph in a case of the high voltage and the great current is collected for further researches.

It should be noted that in actual running of a high-speed train, an electric arc is generated by a pantograph-catenary (pantograph and catenary) in a gap between a pantograph and a catenary in a case of a high voltage and a great current. And therefore, the electric arc generated in the gap between the pantograph and the catenary through the steps above meets requirements of researches on a pantograph-catenary electric arc and can authentically reflect features of the pantograph-catenary electric arc.

In the embodiment, the booster transformer boosts the voltage of the electricity transmitted via the electric network and transmits the high voltage electrical energy to the discharging circuit, to generate the high voltage and the great current in the gap between the catenary wire and the pantograph in the discharging circuit, and the electric arc generated in the gap between the pantograph and the catenary in a case of the high voltage and the great current is collected. In this way, a demand for a high voltage and a great current after the high voltage in the gap between the pantograph and the catenary is met, a power demand on an input end of the electric network is reduced to below 50 KW, a demand for megawatts of instantaneous input power on the electric network is avoided and the technical problem is solved that energy consumption is high due to power supplying with a high voltage alternating current voltage source for generation of a high voltage and a great current in a gap between a pantograph and a catenary in conventional methods for performing a simulation test on a pantograph-catenary electric arc.

Optionally, the discharging circuit 70 may further include a step-down transformer. The step-down transformer is connected to the current limiting resistor and the pantograph and is configured to reduce a voltage of the high voltage electrical energy and transmit the high voltage electrical energy with the reduced voltage to the booster transformer.

To be specific, in the solution, with reference to FIG. 1, an output end of the step-down transformer may be connected to an input end of the booster transformer to form an energy feedback system. In this way, the high voltage electrical energy may be inputted to the booster transformer again, reducing consumption of electrical energy, and a power supply in the above method can have low energy consumption, strong stability and high reliability. Optionally, the step-down transformer above may have a transfer ratio of 1:125 and a capacity of 60 KVA.

Optionally, the collecting device 80 may further include a vibrating apparatus 801 and a collector 802.

The vibrating apparatus 801 is configured to bring coupled vibration between the catenary wire and the pantograph to make the catenary wire and the pantograph be disconnected.

To be specific, in the solution, the coupled vibration may be brought between the catenary and the pantograph to simulate a motion status of the catenary wire and the pantograph in actual running of a train, and with aggravation of the coupled vibration between the catenary wire and the pantograph, a status of electrical contact between the catenary wire and the pantograph will be severely deteriorated, which eventually results in the disconnection between the catenary wire and the pantograph.

The collector 802 is configured to collect the electric arc generated in the gap between the catenary wire and the pantograph in a case that the catenary wire and the pantograph are disconnected.

Optionally, in a case that the collector above is a camera device, images of the electric arc during a process from the electric arc being generated to the electric arc being extinguished are captured with the camera device.

To be specific, in the solution, the images of the pantograph-catenary electric arc during a process from the electric arc being generated to the electric arc being extinguished may be captured with the camera device, to provide a policy for manufacture and operating of a train by analyzing time of arcing, quenching and reigniting of the pantograph-catenary electric arc.

To be specific, in the solution, the images of the pantograph-catenary electric arc during a process from the electric arc being generated to the electric arc being extinguished may be captured with the camera device, to provide a policy for manufacture and operating of a train by analyzing time of arcing, quenching and reigniting of the pantograph-catenary electric arc.

In an optional embodiment, the system for detecting a pantograph-catenary electric arc may include a booster transformer with a transfer ratio of 1:125 and a capacity of 60 KVA to boost the voltage of the alternating current transmitted via the electric network 10.

The present disclosure is described in conjunction with a specific scenario hereinafter.

A high-voltage and great-current power supply apparatus for testing a pantograph-catenary electric arc may be further provided according to the embodiment. With reference to FIG. 1, the apparatus may include the electric network 10, the booster transformer 20, the current limiting resistor 30, the step-down transformer 40, the catenary wire 50 and the pantograph 60. The two-phase alternating current is connected to the input end of the booster transformer 20 via the electric network 10. The output end of the booster transformer 20, the current limiting resistor 30, an input end of the step-down transformer 40, the catenary wire 50 and the pantograph 60 form the discharging circuit. After the gap between the pantograph and the catenary is broken down, a current is formed in the discharging circuit, and energy outputted by the booster transformer 20 is fed back to the input end of the booster transformer 20 via the step-down transformer 40, ensuring safe running of the electric network system.

According to the present disclosure, one booster transformer and one step-down transformer may be used to replace a high voltage alternating current voltage source, and the booster transformer and the step-down transformer may be connected to each other to form a push-pull structure. The output end of the booster transformer is connected to the input end of the step-down transformer, an output end of the step-down transformer is connected to the input end of the booster transformer, and the catenary wire and the pantograph pan (abbreviated as pantograph-catenary) are connected between the two ends of the booster transformer. When the gap between the pantograph and the catenary is broken down by the high voltage electrical energy, the energy outputted by the booster transformer is fed back to the input end of the booster transformer via the step-down transformer, to provide a great current in the gap between the pantograph and the catenary after the breakdown. With the method, a demand for a high voltage and a great current after the high voltage in the gap between the pantograph and the catenary is met, a power demand on an input end of the electric network is reduced to below 50 KW and a demand for megawatts of instantaneous input power on the electric network is avoided.

With reference to FIG. 1, an operating process of the components above is described as follows. The two-phase alternating current is connected to the input end of the booster transformer 20 via the electric network 10. The output end of the booster transformer 20, the current limiting resistor 30, an input end of the step-down transformer 40, the catenary wire 50 and the pantograph 60 form the discharging circuit. Before the gap between the pantograph and the catenary is broken down, there is no current in the discharging circuit and the step-down transformer 40 does not operate. After the gap between the pantograph and the catenary is broken down, a current is formed in the discharging circuit, and the energy outputted by the booster transformer 20 is fed back to the input end of the booster transformer 20 via the step-down transformer 40, ensuring safe running of the electric network system.

According to the present disclosure, a push-pull structure is formed by the booster transformer and the step-down transformer, and feedback control of electrical energy is achieved, which has the following beneficial effects. An output current is stable, and features of the pantograph-catenary electric arc can be authentically reflected, and the power supply has low energy consumption, strong stability and high reliability. The power supply apparatus for testing an electric arc, which is provided according to the present disclosure in view of features of the pantograph-catenary electric arc, has a slight impact on a power supply grid, low energy consumption and a stable power supply waveform.

It should be noted that the foregoing method embodiments are described as a combination of a series of actions for ease of description. Those skilled in the art should know that the disclosure is not limited to the described orders of the actions, for some steps may be performed in other orders or simultaneously according to the present disclosure. Besides, those skilled in the art should also know that the embodiments described in the specification are all preferred embodiments, and the actions and modules involved are not necessarily required by the disclosure.

Description of each of the above embodiments emphasizes on a unique aspect, and reference can be made to related descriptions in other embodiments to understand a part which is not described in detail of an embodiment.

It should be understood that the apparatus according to the embodiments in the present disclosure may be implemented in other ways. For example, the apparatus embodiments described above are illustrative only. For example, division of the units is merely logical function division and there may be other division in practical implementations. For example, some units or components may be combined with each other or integrated into another system, or some features may be ignored or not implemented. In addition, the displayed or discussed mutual couplings or direct couplings or communication connections may be implemented through some interfaces, and the indirect couplings or communication connections between the apparatuses or units may be implemented in electronic or other forms.

The units described as separate components may or may not be physically separate, and components displayed as units may or may not be physical units, which may be located in one position or distributed on multiple network units. Some or all of the units may be selected as needed to achieve the object of the present disclosure.

In addition, functional units in the embodiments according to the present disclosure may be integrated into one processing unit, or each of the units may exist alone physically, or two or more units may be integrated into one unit. The integrated units above may be implemented in the form of hardware, or in the form of software functional units.

In a case that the integrated units are implemented in the form of software functional units and sold or used as an independent product, the integrated units may be stored in a computer readable storage medium. Based on such understanding, essence of the technical solutions of the disclosure, or the part contributing to conventional technology, or all or some of the technical solutions may be implemented in the form of a software product. The computer software product is stored in a storage medium and includes several instructions for instructing a computer device (which may be a personal computer, a mobile terminal, a server, or a web device) to perform all or some of steps of the methods described in the embodiments according to the present disclosure. The storage medium may be any medium which can store program codes, such as a USB flash disk, a read-only memory (ROM, Read-Only Memory), a random access memory (RAM, Random Access Memory), a mobile hard disk drive, a diskette or an optical disc.

The above-described embodiments are only some preferred embodiments of the disclosure and are not intended to limit the disclosure. Modifications and alternations may be made on the present disclosure by those skilled in the art. Any modifications, equivalents or improvements within the spirit and principle of the present disclosure shall fall within the protection scope of the present disclosure.

The invention claimed is:

1. A method for detecting a pantograph-catenary electric arc based on a train power supply system, wherein the train power supply system comprises an electric network and a discharging circuit, the discharging circuit comprising a booster transformer, a current limiting resistor, a step-down transformer, a catenary wire and a pantograph, and the method comprises:
   boosting, by the booster transformer, a voltage of alternating current transmitted via the electric network, to generate high voltage electrical energy, wherein after a gap between the catenary wire and the pantograph is broken down by the high voltage electrical energy, the discharging circuit is turned on, and high voltage and high current electrical energy is generated in the gap between the catenary wire and the pantograph; and
   collecting an electric arc generated in the gap between the catenary wire and the pantograph in a case of the high voltage and high current electrical energy.

2. The method according to claim 1, wherein after the booster transformer boosts the voltage of the alternating current transmitted via the electric network and the high voltage electrical energy is generated, the method further comprises:
   reducing, by the step-down transformer, a voltage of the high voltage electrical energy and transmitting the high voltage electrical energy with the reduced voltage to the booster transformer.

3. The method according to claim 1, wherein the step of collecting the electric arc generated in the gap between the catenary wire and the pantograph in a case of the high voltage and the high current comprises:
   bringing coupled vibration between the catenary wire and the pantograph to make the catenary wire and the pantograph be disconnected; and
   collecting the electric arc generated in the gap between the catenary wire and the pantograph in a case that the catenary wire and the pantograph are disconnected.

4. The method according to claim 3, wherein the step of collecting the electric arc generated in the gap between the catenary wire and the pantograph in a case that the catenary wire and the pantograph are disconnected comprises:
   capturing images of the electric arc during a process from the electric arc being generated to the electric arc being extinguished with a camera device.

5. A system for detecting a pantograph-catenary electric arc based on a train power supply system, comprising:
   an electric network, configured to transmit electrical energy;
   a discharging circuit comprising a booster transformer, a current limiting resistor, a catenary wire and a pantograph, wherein the booster transformer is configured to boost a voltage of alternating current transmitted via the electric network to generate high voltage electrical energy, wherein after a gap between the catenary wire and the pantograph is broken down by the high voltage electrical energy, the discharging circuit is turned on, and high voltage and high current electrical energy is generated in the gap between the catenary wire and the pantograph; and
   a collecting device, configured to collect an electric arc generated in the gap between the catenary wire and the pantograph in a case of the high voltage and high current electrical energy.

6. The system according to claim 5, wherein the discharging circuit further comprises:
   a step-down transformer, connected to the current limiting resistor and the pantograph and configured to reduce a voltage of the high voltage electrical energy and transmit the high voltage electrical energy with the reduced voltage to the booster transformer.

7. The system according to claim 5, wherein the collecting device comprises:
   a vibrating apparatus, configured to bring coupled vibration between the catenary wire and the pantograph to make the catenary wire and the pantograph be disconnected; and
   a collector, configured to collect the electric arc generated in the gap between the catenary wire and the pantograph in a case that the catenary wire and the pantograph are disconnected.

8. The system according to claim 7, wherein, the collector is a camera device, and the camera device is configured to capture images of the electric arc during a process from the electric arc being generated to the electric arc being extinguished.

9. The system according to claim 8, wherein the booster transformer has a transfer ratio of 1:125 and a capacity of 60 KVA.

* * * * *